United States Patent
Han et al.

(10) Patent No.: US 7,371,467 B2
(45) Date of Patent: May 13, 2008

(54) PROCESS CHAMBER COMPONENT HAVING ELECTROPLATED YTTRIUM CONTAINING COATING

(75) Inventors: Nianci Han, San Jose, CA (US); Li Xu, San Jose, CA (US); Hong Shih, Walnut, CA (US); Yang Zhang, Albany, CA (US); Danny Lu, Milpitas, CA (US); Jennifer Y. Sun, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 10/824,123

(22) Filed: Apr. 13, 2004

(65) Prior Publication Data

US 2004/0191545 A1 Sep. 30, 2004

Related U.S. Application Data

(63) Continuation-in-part of application No. 10/042,666, filed on Jan. 8, 2002, now Pat. No. 6,942,929.

(51) Int. Cl.
*B32B 15/04* (2006.01)
*B32B 15/20* (2006.01)
*B01J 19/02* (2006.01)
*B05C 11/00* (2006.01)
*G03F 7/16* (2006.01)

(52) U.S. Cl. .............. 428/632; 428/633; 428/660; 422/241; 118/506; 118/715

(58) Field of Classification Search .............. 428/655, 428/660, 656, 639, 632, 633, 935; 422/241, 422/129; 119/715, 726, 504, 506
See application file for complete search history.

(56) References Cited

U.S. PATENT DOCUMENTS 3,754,903 A * 8/1973 Goward et al. .............. 420/443
4,244,743 A 1/1981 Blackburn et al.

(Continued)

FOREIGN PATENT DOCUMENTS

DE 3543802 A1 6/1987

(Continued)

OTHER PUBLICATIONS

An article titled, "The evolution of DRAM cell technology," Solid State Technology 89-101 (May 1997), El-kareh et al.

(Continued)

*Primary Examiner*—Michael E. Lavilla
(74) *Attorney, Agent, or Firm*—Janah & Associates, P.C.

(57) ABSTRACT

A component capable of being exposed to a plasma in a process chamber has a structure having an electroplated coating comprising yttrium-containing species. The electroplated coating is resistant to corrosion in the plasma, and can have a compositional gradient of yttrium-containing species through a thickness of the coating. In one embodiment, the coating is formed by electroplating a layer comprising yttrium onto the surface, and then electroplating a second layer onto the first layer, and annealing the first and second layers. The second layer can comprise aluminum or zirconium. In another embodiment, the coating is formed by electroplating a layer comprising a mixture of aluminum and yttrium onto the surface and annealing the layer.

30 Claims, 5 Drawing Sheets

U.S. PATENT DOCUMENTS

| | | | |
|---|---|---|---|
| 4,433,004 A | 2/1984 | Yonezawa et al. | |
| 4,743,493 A | 5/1988 | Sioshansi et al. | |
| 4,897,315 A | 1/1990 | Gupta | |
| 4,910,092 A | 3/1990 | Olson et al. | |
| 4,933,239 A | 6/1990 | Olson et al. | |
| 4,939,308 A | 7/1990 | Maxfield et al. | |
| 4,973,445 A | 11/1990 | Singheiser et al. | |
| 5,244,875 A | 9/1993 | Hauser et al. | |
| 5,366,585 A | 11/1994 | Robertson et al. | |
| 5,470,820 A | 11/1995 | Hauser et al. | |
| 5,498,313 A | 3/1996 | Bailey et al. | |
| 5,624,632 A | 4/1997 | Baumann et al. | |
| 5,680,013 A | 10/1997 | Dornfet et al. | |
| 5,753,044 A | 5/1998 | Hanawa et al. | |
| 5,798,016 A | 8/1998 | Oehrlein et al. | |
| 5,807,613 A * | 9/1998 | Aguero et al. | 427/528 |
| 5,824,205 A | 10/1998 | Foster | |
| 5,833,829 A | 11/1998 | Foster | |
| 5,948,516 A | 9/1999 | Kriven et al. | |
| 5,964,928 A | 10/1999 | Tomlinson et al. | |
| 6,004,631 A | 12/1999 | Mori | |
| 6,123,791 A | 9/2000 | Han et al. | |
| 6,231,808 B1 | 5/2001 | Hashikura et al. | |
| 6,287,644 B1 * | 9/2001 | Jackson et al. | 427/566 |
| 6,447,937 B1 * | 9/2002 | Murakawa et al. | 428/696 |
| 6,776,873 B1 * | 8/2004 | Sun et al. | 156/345.41 |
| 2001/0003271 A1 * | 6/2001 | Otsuki | 118/723.001 |
| 2002/0012791 A1 * | 1/2002 | Morita et al. | 428/336 |
| 2002/0086153 A1 * | 7/2002 | O'Donnell et al. | 428/336 |
| 2003/0029563 A1 | 2/2003 | Kaushal et al. | |
| 2004/0002221 A1 * | 1/2004 | O'Donnell et al. | 438/710 |

FOREIGN PATENT DOCUMENTS

| | | |
|---|---|---|
| DE | 9421671 | 8/1996 |
| EP | 0849767 A2 | 6/1998 |
| EP | 0997546 A1 | 5/2000 |
| JP | 59205468 | 11/1984 |
| JP | 62174377 | 7/1987 |
| JP | 04333573 | 11/1992 |
| JP | 10067554 | 3/1998 |
| JP | 11029378 A2 | 2/1999 |
| JP | 11-229142 * | 8/1999 |
| JP | 2000-096176 | 4/2000 |
| JP | 2000-164572 | 6/2000 |
| WO | 9814980 | 4/1998 |
| WO | WO 2004003962 A2 | 1/2004 |

OTHER PUBLICATIONS

PCT Communication dated Nov. 25, 1999, European Patent Office, P.B. 5818 Patentlaan, NL-2280 HV Rijwik.

Hart, Anthony C, "Alloy plating problem cracked" Nickel Magazine, Jun. 1998.

Praxair, Tribomet McrAIY Coatings, Praxair Surface Technologies, Ltd, 2002, Available at http://www.praxair.com/praxair.nsf/d63afe71c771b0d785256519006c5eal/cccb361d6209c12b/$, no month.

* cited by examiner

PROCESS CHAMBER COMPONENT HAVING ELECTROPLATED YTTRIUM CONTAINING COATING

CROSS-REFERENCE

This application is a continuation-in-part of U.S. Pat. No. 6,942,929, application Ser. No. 10/042,666, entitled "Process Chamber Having Yttrium-Aluminum Coating" to Han et al, assigned to Applied Materials, Inc. and filed on Jan. 8, 2002, which is herein incorporated by reference in its entirety.

BACKGROUND

The present invention relates to a substrate processing chamber component and methods of manufacturing the same.

In processing of a substrate in a process chamber, as in the manufacture of integrated circuits and displays, the substrate is typically exposed to energized gases that are capable of, for example, etching or depositing material on the substrate. The energized gases can also be provided to clean surfaces of the chamber. However, the energized gases can often comprise corrosive halogen-containing gases and other energized species that can erode components of the chamber, such as the chamber enclosure wall. For example, chamber components made of aluminum can chemically react with energized halogen-containing gases to form $AlCl_3$ or $AlF_3$, thereby corroding the components. The corroded portions of the components can flake off and contaminate the substrate, which reduces the substrate yield. Thus, the corroded components must often be replaced or removed from the chamber and cleaned, resulting in undesirable chamber downtime.

The corrosion resistance of a chamber component can be improved by forming a coating of a corrosion resistant material over surfaces of component that are susceptible to erosion, such as surfaces that would otherwise be exposed to the energized gas. The corrosion resistant coating can be formed by methods such as plasma spraying or thermal spraying coating material onto the surface of an underlying structure of the component. For example, a coating of aluminum oxide can be plasma sprayed onto the surface of an aluminum chamber wall to form a coating that exhibits improved corrosion resistance.

However, while such coatings improve the corrosion resistance of the chamber components, the components having the coatings can exhibit other problems during chamber processes. For example, thermal expansion mismatch between the coating and underlying component structure can lead to stresses at the interface between the coating and underlying structure that causes the coating to flake off the underlying structure, thereby exposing the underlying structure to the corrosive energized gas. The particles of loose coating material can also deposit on and contaminate the substrates being processed in the chamber. The thermal expansion mismatch problem is further exacerbated if there is frequent thermal cycling between or during substrate processing steps.

Thus, there is a need for a chamber and chamber components that exhibit improved corrosion or erosion resistance to energized gases. There is a further need for durable chamber components that are not easily susceptible to flaking off during operation of the chamber, especially when the chamber is subjected to thermal cycling.

SUMMARY

In one embodiment of the invention, a plasma resistant component capable of being exposed to a plasma in a process chamber has a structure having an electroplated coating comprising yttrium-containing species. The coating is capable of providing corrosion resistance to the plasma, and can have a concentration gradient of yttrium-containing species through a thickness of the coating.

The component can be used in a process chamber comprising a wall around a process zone, a substrate support in the process zone, a ring about the substrate, a gas distributor, a gas energizer, and a gas exhaust port. At least one of the wall, substrate support, ring, or gas distributor, comprises a plasma resistant component capable of being exposed to a plasma in the process chamber, the component comprising a structure having an electroplated coating comprising yttrium-containing species. A substrate transported into the process chamber can be processed by a gas released by the gas supply, energized by the gas energizer, and exhausted by the gas exhaust.

In another embodiment, a method of forming a plasma resistant component that is capable of being exposed to a plasma in a process chamber, comprises forming a structure comprising a surface; and electroplating yttrium onto the surface of the structure.

In yet another embodiment, the component can be formed by electroplating a first layer comprising aluminum onto the surface and electroplating a second layer comprising yttrium onto the first layer, and annealing the first and second layers.

DRAWINGS

These and other features, aspects, and advantages of the present invention will become better understood with regard to the following description, appended claims, and accompanying drawings which illustrate examples of the invention, where:

DESCRIPTION

Figure 1:
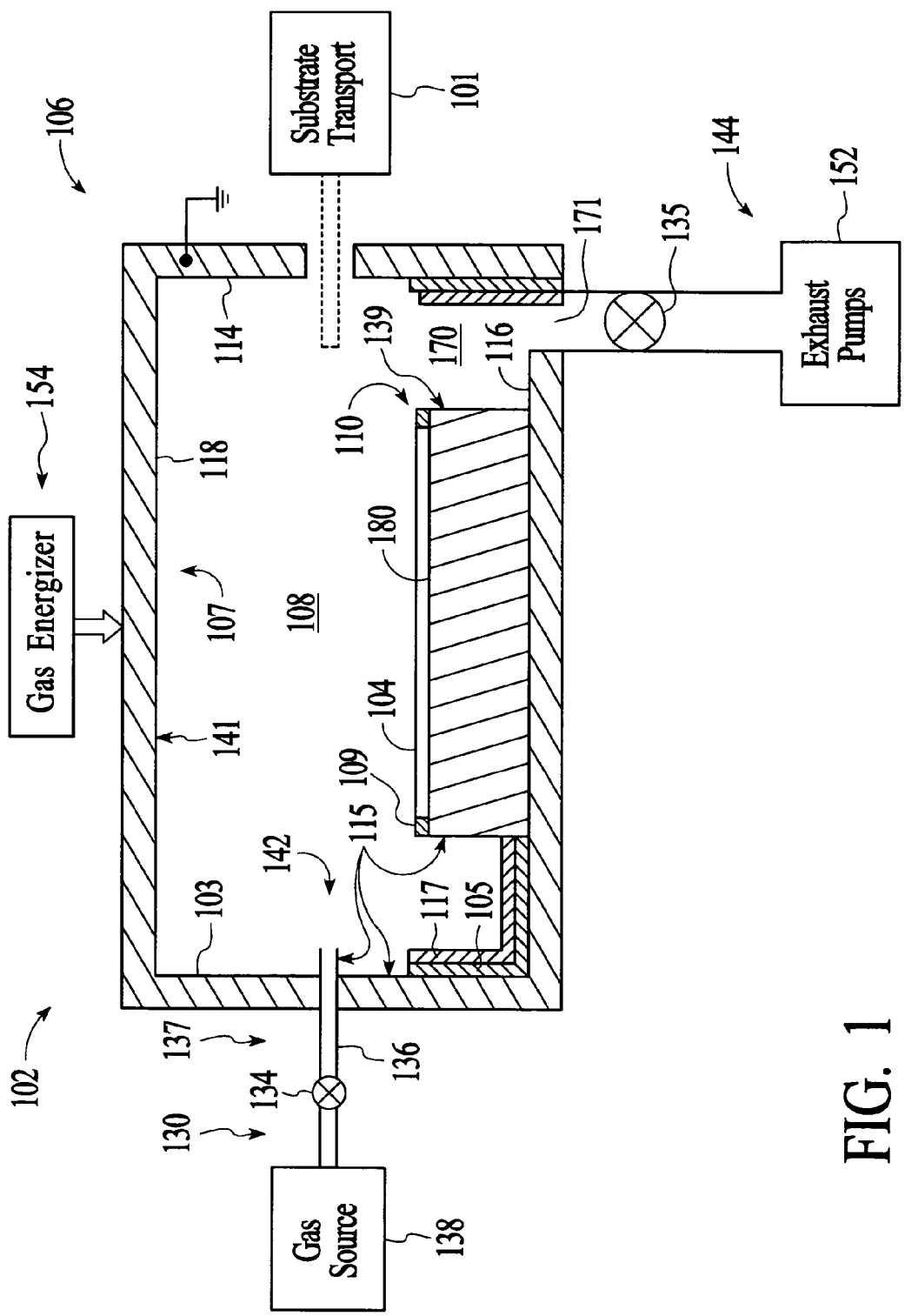
FIG. 1 is a schematic sectional side view of a version of an embodiment of a process chamber according to the present invention.

The corrosion resistance of a chamber component 114 is improved by providing an integral surface coating 117 comprising yttrium-containing species. The integral surface coating 117 is provided to protect the surfaces 115 of components 114 that are exposed to energized gas plasmas, high temperatures, corrosive gases, and/or erosive sputtering species in the process zone 108 of a process chamber, or that are otherwise susceptible to erosion. For example, the component 114 having the integral surface coating 117 can comprise at least a portion or structure of one or more of a chamber wall 107, chamber liner 105, substrate support 110, gas supply 130, gas energizer 154, gas exhaust 144, and substrate transport 101. For example, in one version, the component 114 having the integral surface coating 117 comprises a portion of the chamber liner 105, as shown in FIG. 1.

Figure 2:
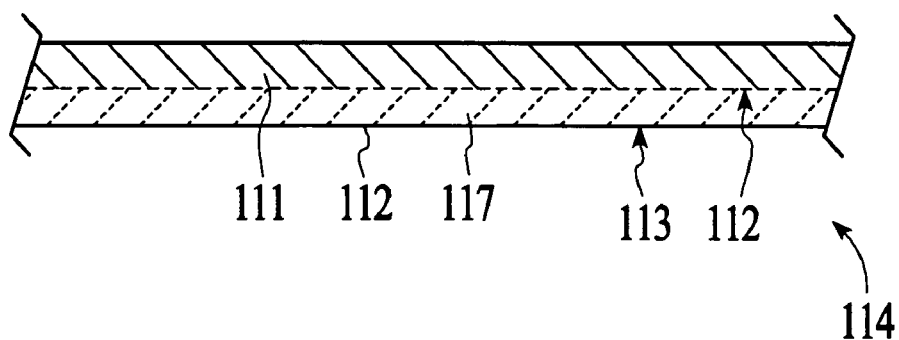
FIG. 2 is a partial sectional schematic side view of a chamber component comprising an integral surface coating comprising yttrium-containing species.

The integral surface coating 117 covers at least a portion of an underlying structure 111 of the component 114 and forms a unitary and continuous structure that is absent a discrete and sharp crystalline boundary therebetween, as schematically illustrated in FIG. 2 with a dotted line. In one version, the integral surface coating is formed in-situ from the surface of the component 114 using the underlying component material. By "growing" the surface coating 117 out of the underlying structure of which the component 114 is fabricated, the surface coating 117 is more strongly bonded to the underlying component material or structure than conventional coatings, such as plasma sprayed coatings, which have a discrete interface with the underlying component structure. The strongly bonded integral surface coating 117 can better withstand thermal stresses and reduces flaking off of the coating and resultant contamination of the substrates 104.

The integral surface coating 117 comprises yttrium-containing species that provide corrosion resistance in a processing environment, such as at least one of elemental yttrium and yttrium oxide ($Y_2O_3$). In particular, oxidized yttrium species improves corrosion resistance, and thus, the presence of these species in the coating 117 is desirable. The surface coating 117 can also comprise other corrosion resistant species in combination with the yttrium-containing species. For example, the coating 117 can comprise corrosion resistant species comprising aluminum-containing species, such as elemental aluminum and aluminum oxide. The coating 117 can also comprise yttrium-aluminum alloys and compounds, such as a yttrium-aluminum compound having a predefined stoichiometric ratio of yttrium oxide and aluminum oxide, as in yttrium aluminum garnet (YAG).

In another version, the coating 117 comprises zirconium-containing species in addition to the yttrium-containing species, such as for example, elemental zirconium or zirconium oxide. The combination of the yttrium-containing and zirconium-containing material can be tailored to provide partially stabilized zirconia (PSZ) or tetragonal zirconia polycrystals (TZP). PSZ comprises zirconia polymorphs, such as cubic and metastable tetragonal $ZrO_2$, and is obtained by adding a controlled amount of cubic phase-forming stabilizer oxide material, such as yttrium oxide. The addition of stabilizer to zirconia forces the structure into a tetragonal phase at temperatures higher than 1,000° C., and a mixture of cubic phase and monoclinic (or tetragonal) phases at lower temperatures. The partially stabilized zirconia is also called tetragonal zirconia polycrystal (TZP). Typically, PSZ comprises at least about 3 wt % of MgO, 2 to 6 wt % of CaO, or 3 to 9 wt % of $Y_2O_3$. PSZ is a transformation-toughened material because of microcracks and induced stress phenomena. Microcracks, which occur due to the difference in thermal expansion between the cubic, and monoclinic or tetragonal phase, dissipate the energy of propagating cracks. Induced stress arises from the tetragonal-to-monoclinic transformation. The presence of the cubic matrix provides a compressive force that maintains the tetragonal phase. Energy from a propagating crack causes a transition from the metastable tetragonal to the stable monoclinic phase to slow or stop propagation of the cracks. The zirconium oxide can also form a zirconia dispersion toughened ceramic (ZTC) in which tetragonal zirconia is dispersed in another ceramic, such as aluminum oxide or yttrium oxide, to toughen the ceramic.

The coating 117 can also comprise a concentration gradient of yttrium-containing species through a thickness of the coating 117. In one version, the composition of the coating 117 gradually varies from the coating surface to the underlying interface. For example, the coating 117 can comprise a concentration gradient in which the concentration of a species varies so that is matches the composition of the underlying structure, and gradually changes with thickness to reach a desirable erosion resistant stoichiometric composition at the coating surface. The matching composition of the coating to the underlying structure 111 allows the coating to bond well to the underlying structure 111, while the surface composition is tailored to provide better corrosion or other resistance. In one version, the concentration gradient provides a first concentration of yttrium-containing species in a first region of the coating 117, such as at the surface 113 of the coating 117, and a second concentration in a second region, such as towards the surface 112 of the underlying structure 111 that is lower than the first. For example, the coating 117 can comprise a concentration gradient of one or more of elemental yttrium, yttrium oxide, and yttrium aluminum oxide that decreases the concentration of the yttrium-containing species from a first concentration at the surface 113 of the coating 117, to a second concentration at the surface 112 of the underlying structure 111, without forming discrete boundaries regions in the coating 117, and at a gradual rate throughout a thickness of the coating 117.

The surface coating 117 can also comprise a second concentration gradient of a second species, such as aluminum or zirconium-containing species, comprising at least one of elemental aluminum, elemental zirconium, aluminum oxide and zirconium oxide. The second concentration gradient can increase or decrease with the first concentration gradient of yttrium-containing species, or can be substantially opposite the yttrium-containing species concentration gradient. In one version, the second concentration gradient provides an increase in a first concentration of an aluminum-containing species at the surface 113 of the coating 117, to a second concentration that is higher than the first at the surface 112 of the underlying structure 111. The resulting structure provides enhanced bonding to the underlying structure 111 while also providing improved corrosion resistance.

The composition and thickness of the integral surface coating 117 is selected to enhance its resistance to corrosion and erosion, or other detrimental effects. For example, a thicker integral surface coating 117 may provide a more substantial barrier to corrosion of the chamber component 114, while a thinner coating is more suitable for thermal shock resistance. The integral surface coating 117 may even be formed such that the oxidized species extend throughout the depth of the component or just on its surface. A suitable thickness of the oxidized species in the integral surface coating 117 may be, for example, from about 12 micrometers (0.5 mils) to about 203 micrometers (8 mils), or even from about 25 micrometers (1 mil) to about 102 micrometers (4 mils.)

The component 114 having the integral surface coating 117 can be formed by electroplating yttrium metal onto the surface 112 of an underlying structure 111 and subsequently annealing the coating and underlying structure 111. One or more of the other corrosion resistant species, such as aluminum and zirconium metals, can also be electroplated onto the structure 111. Electroplating of the metals provides a layer that is well bonded to the underlying surface 112 and protects the underlying surface 112 from corrosion. Annealing the structure 111 and electroplated metals diffuses the electroplated metals and underlying structure 111 into one another to provide a unitary component structure.

Figure 3:
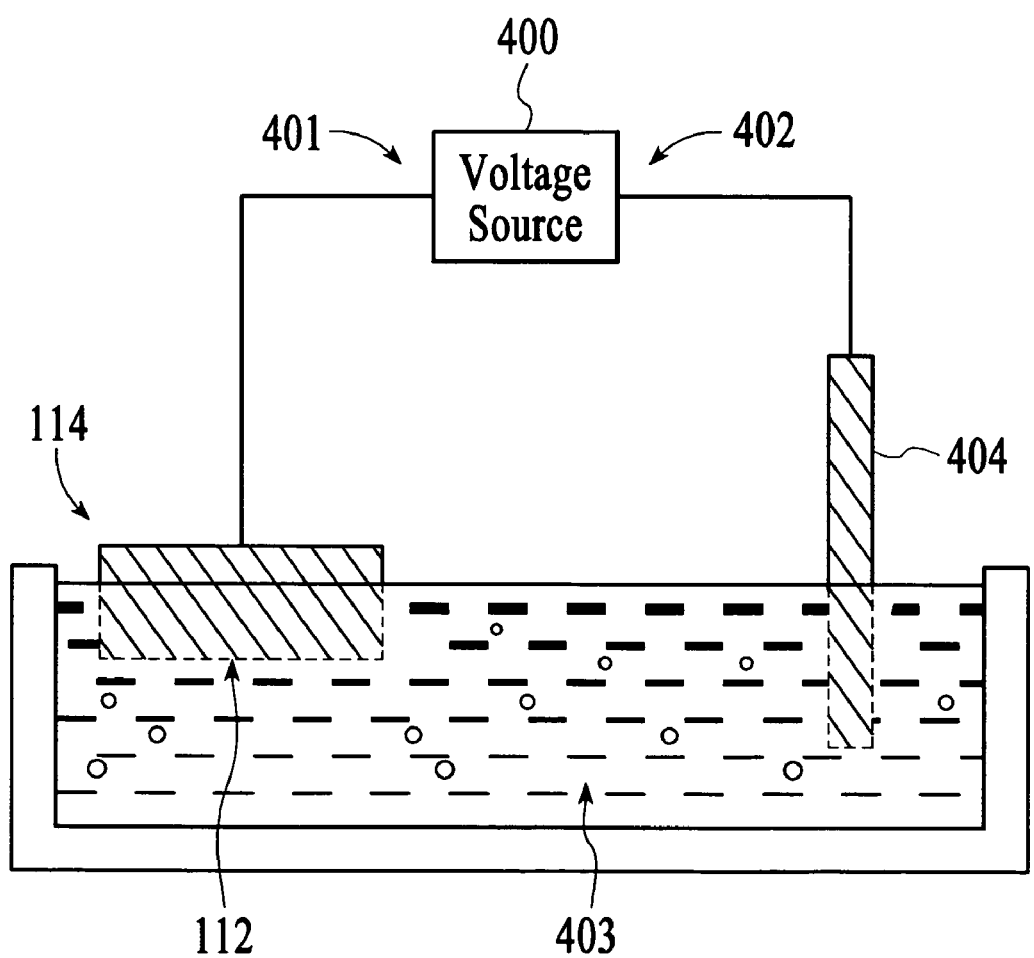
FIG. 3 is a schematic sectional side view of an electroplating apparatus.

The metals can be electroplated onto the structure 111 by reducing one or more of yttrium, aluminum and zirconium-containing species to their elemental metal state at the surface 112 of the structure 111. In the electroplating process, the surface 112 of the component 114 to be electroplated serves as a cathode and is connected to a negative terminal 401 of a voltage source 400, as shown for example in FIG. 3. The surface 112 is immersed in an electroplating bath 403 comprising, for example, an aqueous solution having one or more yttrium, aluminum and zirconium-containing electrolytes dissolved therein. An anode 404 connected to the positive terminal 402 of the voltage source is also immersed in the bath 403, the anode comprising an inert material or even the material to be electroplated. Application of a bias voltage to the cathode 114 and anode 404 from the voltage source 400 builds up a negative charge on the surface 112 of the structure 111, attracting the charged electrolyte species in the solution, which are then reduced to their elemental form at the surface 112. In other words, the metals are "plated out" onto the surface 112 of the structure 111.

The electroplating conditions, such as the concentration and composition of the electrolytes, the voltage applied, the pH of the bath solution and the temperature may be selected to provide electroplated layers having the desired composition and structure. Suitable yttrium containing electrolytes can comprise, for example, one or more of yttrium bromide, yttrium chloride, yttrium fluoride, yttrium nitrate, yttrium perchlorate, yttrium carbonate, yttrium sulfate, yttrium hydroxide, yttrium iodate and yttrium acetate. Aluminum containing electrolytes can comprise, for example, one or more of aluminum chloride, aluminum bromide, aluminum fluoride, and aluminum hydroxide. Zirconium containing electrolytes can comprise, for example, one or more of zirconium nitrate, zirconium silicate, zirconium sulfate and zirconium citrate. In addition or as an alternative to an aqueous (water-based) bath, the bath solution can comprise an organic solvent, such as for example dimethylformamide (DMF), dimethylsulfoxide (DMSO), dimethoxyethane (DME), and tetrahydrofuran (THF). Other suitable electroplating conditions, such as different plating bath compositions and other electrolytes can also be used.

In one version, the metals are electroplated onto the surface 112 of an underlying structure 111 that comprises a material that is similar to the electroplated metals, such as for example one or more of yttrium, aluminum and zirconium containing materials. By electroplating materials onto a structure 111 having a similar composition, the electroplated metals can be "grown" on the surface 112 of the underlying structure 111 to form a strongly bonded coating 117 without a discrete boundary between the coating 117 and underlying structure 111. For example, the underlying structure 111 can comprise an aluminum alloy that forms a strongly bonded continuous structure with an electroplated aluminum metal. The aluminum alloy is a mixture of aluminum with smaller amounts of one or more of copper, magnesium, manganese, gold, titanium, zinc, silicon and iron. In one version, the underlying structure comprises an aluminum alloy comprising at least about 90% by weight aluminum, and at most about 10% other metals. In another version, the underlying structure 111 comprises a yttrium containing material, such as a yttrium-aluminum alloy. The underlying structure 111 can also comprise a zirconium-containing alloy.

After electroplating one or more layers of metals onto the surface 112, the surface 112 of the component 114 and the electroplated material are annealed to form the integral surface coating 117. In the annealing process, the component 114 having the electroplated metals is heated to a temperature where the structure of the electroplated metals and underlying structure 111 begins to break up, and materials from the electroplated metal and structure 111 at least partially diffuse into each other. The intermixing of the materials between the electroplated layer and underlying structure 111 forms a more integral and unitary coating 117 without a discrete boundary, thereby strengthening the corrosion resistance of the coating 117. The mixture of the materials provides a gradual change in composition from the surface 112 of the underlying structure 111 to the surface 113 of the coating 117 that resists flaking of the coating 117 and reduces thermal mismatch problems between the underlying structure 111 and coating 117. The annealing process can also be repeated a desired number of times to achieve intermixing between the electroplated materials and underlying structure 111.

Furthermore, by annealing the coating 117 in a oxygen containing atmosphere, corrosion resistant oxides of one or more of yttrium, aluminum and zirconium can be formed in the electroplated coating 117. For example, the coating 117 can be annealed in the presence of one or more of $O_2$, $O_3$ and $H_2O$ to form oxides that show resistance to erosion by energized gases. The heat provided during the annealing process also facilitates the oxidation of the coating materials by speeding up the oxidation reaction. The oxidized species formed by annealing the component 114 can comprise one or more of as $Y_2O_3$ and $Al_2O_3$, as well as oxidized yttrium aluminum compounds, such as yttrium aluminum garnet (YAG.) Other oxidized species such as zirconium oxide ($ZrO_2$) in various phases can also form, according to the composition of materials electroplated onto the structure. Also, because the oxygen containing atmosphere contacts the surface 113 of the coating 117, the annealing process results in a coating composition having a concentration gradient of oxidized species, with a greater concentration of oxidized species near the surface 113 of the coating 117, thus enhancing the corrosion resistance of the coating 117.

Figure 4:
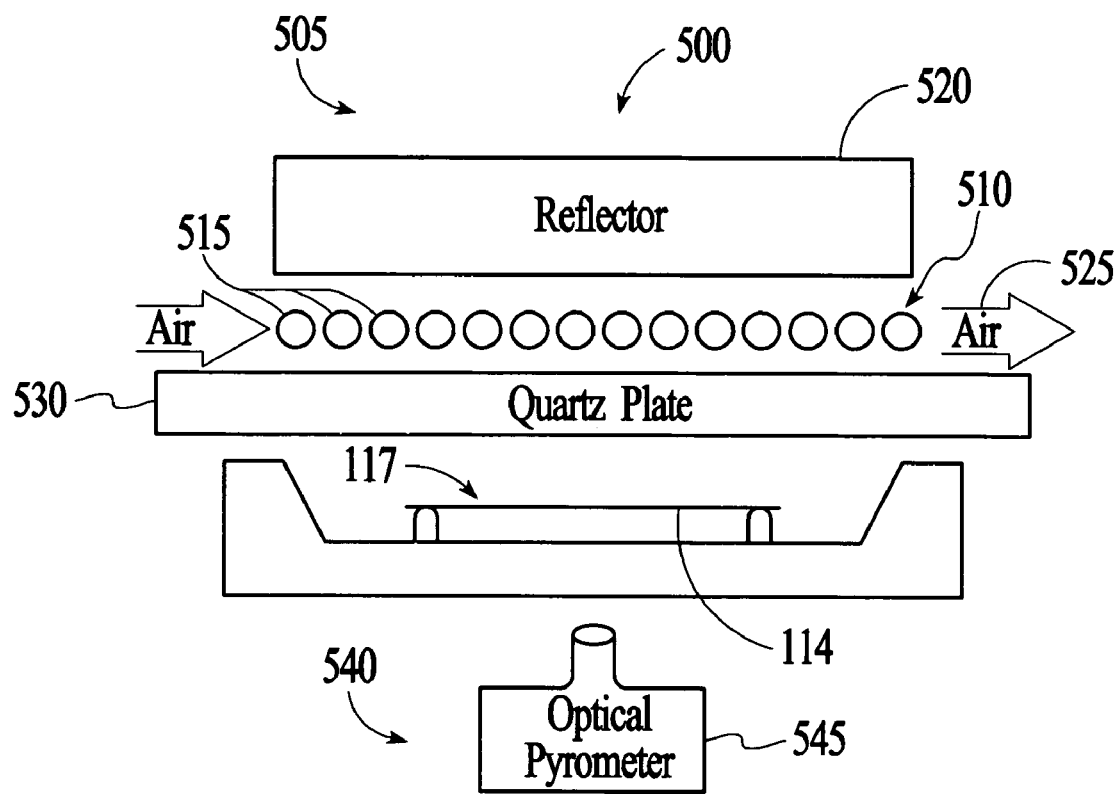
FIG. 4 is a schematic sectional side view of an annealer.

A version of an annealer 500 suitable for annealing the coating 117 is illustrated in FIG. 4. Typically, the annealer 500 comprises a heat source 510, such as an incoherent or coherent electromagnetic radiation source, that is capable of heating the component 114 to a suitable temperature for annealing. For example, the annealer 500 may heat the component 114 to a temperature of at least about 600° C., such as for example, at least about 900° C. In the embodiment shown in FIG. 4, the annealer 500 is a rapid thermal annealer 505 comprising a heat source 510 that includes tungsten halogen lamps 515 to generate radiation and a reflector 520 to reflect the radiation onto the component 114. A fluid 525, such as air or water is flowed along the heat source 510 to regulate the temperature of the heat source 510. In one version, a quartz plate 530 is provided between the heat source 510 and the component 114 to separate the fluid from the component 114. The rapid thermal annealer 505 may further comprise a temperature monitor 540 to monitor the temperature of the component 114. In one embodiment, the temperature monitor 540 comprises an optical pyrometer 545 that analyzes radiation emitted by the component 114 to determine a temperature of the component 114.

Figure 5A:
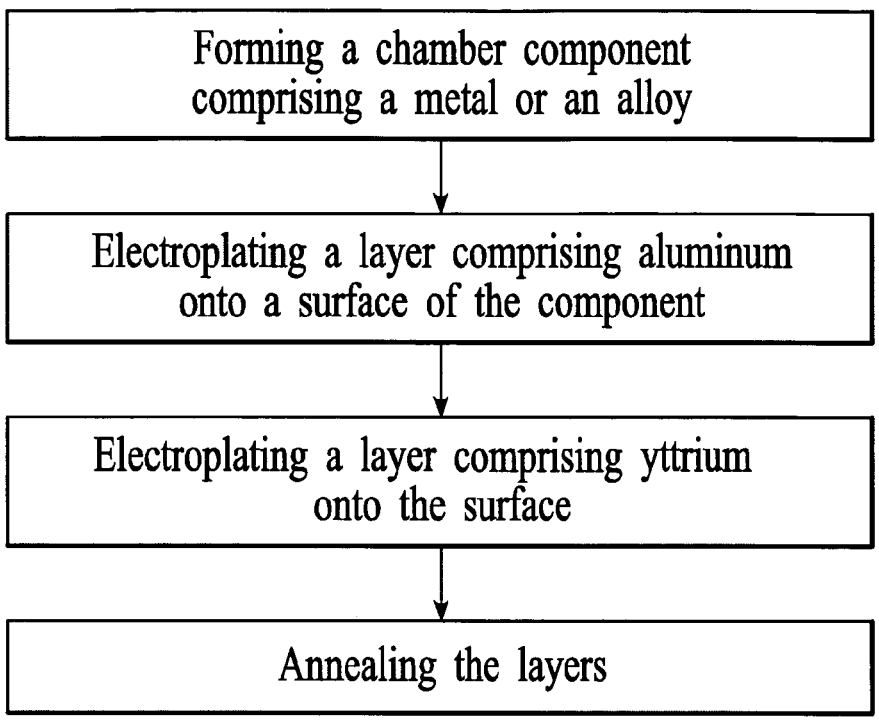
FIG. 5a is a flow chart of an embodiment of a process for electroplating layers comprising yttrium and aluminum on a surface of a component and annealing the layers to form an integral surface coating.

FIG. 5a illustrates an embodiment of an electroplating and annealing method of chamber component manufacture. In this embodiment, a chamber component 114 comprising an underlying structure 111 is formed from a metal or an alloy, such as an aluminum alloy. A first layer 119 comprising a first material, such as aluminum, is electroplated onto the surface 112 of the structure 111. After the first layer 119 has been electroplated, a second layer 120 comprising a second material, such as yttrium, is electroplated onto the surface 112 of the structure 111. The first and second layers are then annealed to form the integral surface coating 117.

Figure 6A:
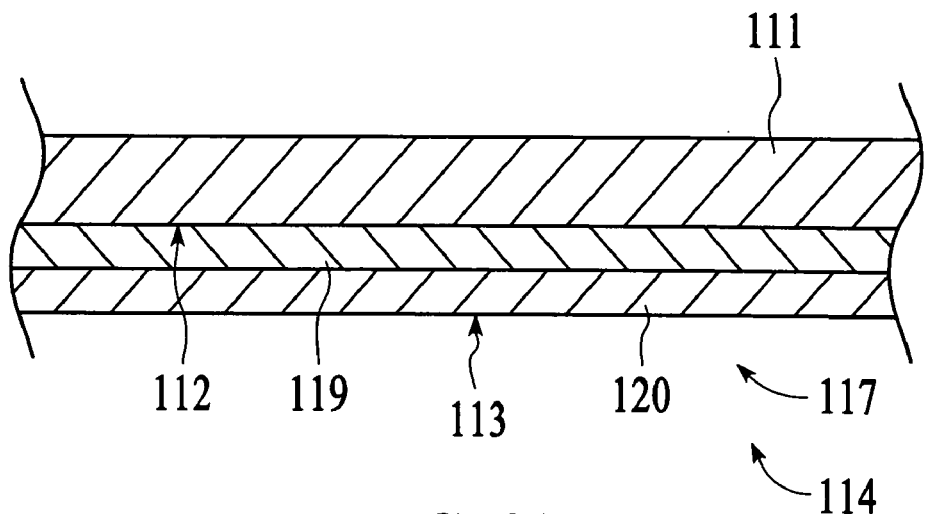
FIG. 6a is a partial sectional schematic side view of a chamber component comprising a coating having first and second electroplated layers.

The coating 117 having the first and second layers 119, 120, is formed by exposing the surface 112 of the underlying structure 111 to electroplating conditions that result in selective plating of a desired material. For example, the surface 112 can be exposed to a bath comprising the desired first material present as an electrolyte in the solution and substantially absent the second material, to form a first layer 119 comprising the desired first material. Once the first layer 119 has been formed, the surface 112 is exposed to a bath comprising the desired second material, and substantially absent the first material, to form the second layer 120. FIG. 6a shows the integral surface coating 117 formed by electroplating the first and second layers 119,120. In one version, the surface 112 is exposed to conditions to electroplate a first layer 119 comprising aluminum, and thereafter exposed to conditions to electroplate a second layer 120 comprising yttrium. The electroplating conditions can alternatively be selected to electroplate a first layer 119 comprising yttrium, and a second layer 120 comprising aluminum. Electroplating conditions can be further selected to electroplate one or more of a first layer 119 and second layer 120 comprising zirconium. The layers may also be alternated a desired number of times to achieve a coating 117 having the desired composition.

In one version of an electroplating process suitable for the formation of the first and second layers 119, 120, a first layer 119 comprising aluminum is electroplated onto the surface 112 by immersing the surface 112 in an aqueous solution comprising, for example, one or more of aluminum chloride, aluminum bromide, aluminum fluoride and aluminum hydroxide. A suitable bias voltage is applied to the surface 112 to form the layer 119 of aluminum metal. A second layer 120 comprising yttrium is then plated over the first layer 119 by immersing the surface of the first layer 119 in an aqueous solution comprising, for example, one or more of yttrium bromide, yttrium chloride, yttrium fluoride, yttrium nitrate, yttrium perchlorate, yttrium carbonate, yttrium sulfate, yttrium hydroxide, yttrium iodate and yttrium acetate, and applying a suitable bias voltage to bias the surface 112 and form the layer 120 of yttrium metal. Suitable concentrations of the aluminum and yttrium-containing electrolytes in the solutions may be, for example, from about 0.1 mM to about 50 M, and a suitable bias voltage for depositing the layers 119, 120 may be, for example, a bias voltage that is sufficient to provide a current density of from about 0.1 A/dm$^2$ to about 100 A/dm$^2$ (amps per decimeter squared). In addition or as an alternative to an aqueous (water-based) bath, the bath solution can comprise an organic solvent, such as for example one or more of dimethylformamide, dimethylsulfoxide, dimethoxyethane, and tetrahydrofuran.

The coating 117 having the first and second layers 119, 120 is then annealed, for example in the annealer shown in FIG. 4, to provide the unitary coating structure, as shown in FIG. 2, and to form corrosion resistant oxides. Annealing of the layers 119, 120 also inter-diffuses material between the layers 119,120 to form a concentration gradient of species that provides a gradual change in the coating composition throughout the thickness of the coating 117. The annealing of the layers 119, 120 can also provide a concentration gradient of one or more yttrium-containing species through the thickness of the coating 117 that improves bonding to the underlying structure 111 and enhances corrosion resistance.

Figure 5B:
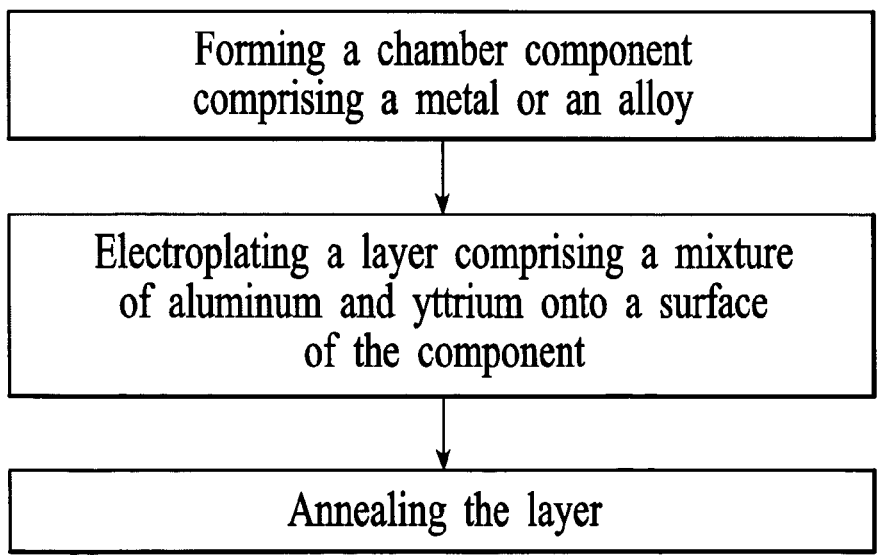
FIG. 5b is a flow chart of an embodiment of a process for electroplating a layer comprising a mixture of yttrium and aluminum on the surface of a component and annealing the layer to form an integral surface coating.

Yet another embodiment of an electroplating and annealing method of chamber component manufacture is illustrated in the flow chart of FIG. 5b. In this embodiment, a chamber component 114 comprises an underlying structure 111 formed from a metal or an alloy. A layer 121 comprising a mixture of species, such as a mixture of aluminum and yttrium, is then electroplated onto the surface 112 of the component 114. The electroplated layer 121 is annealed to form the integral surface coating 117 and to provide corrosion resistant oxidized species.

Figure 6B:
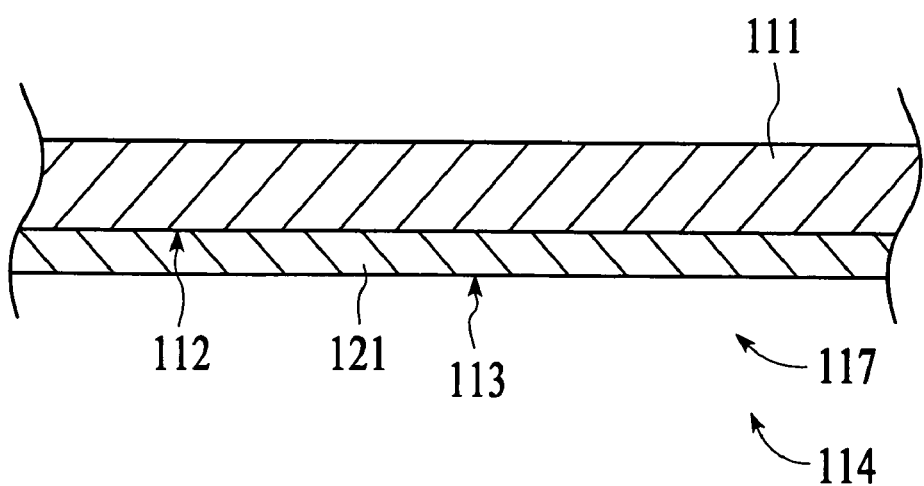
FIG. 6b is a partial sectional schematic side view of a chamber component comprising a coating having an electroplated layer comprising a mixture of yttrium-containing and other species.

The layer 121 comprising the mixture of species is formed by co-depositing metals such as yttrium and at least one of aluminum and zirconium metals on the surface 112 of the structure 111 in an electroplating process. For example, to form a co-deposited layer 121 of yttrium and aluminum, the surface 112 of the structure 111 is immersed in a bath 404 comprising electrolytes of both yttrium and aluminum, and the electroplating conditions, such as the voltage, electrolyte composition and concentration, and temperature, are set such that a mixture of both yttrium and aluminum are plated out simultaneously on the surface 112 of the structure 111, as shown in FIG. 6b. Following deposition of the co-deposited layer 121 comprising the mixture of materials, the structure 111 and layer 121 are annealed to form the integral surface coating 117 having improved corrosion resistance, as shown in FIG. 2. In one version, the co-deposited layer 121 comprises substantially the entire coating 117. One or more other layers of materials, such as layers of yttrium and aluminum, can also be electroplated on the structure 111 in addition to the co-deposited layer.

In one version, a co-deposited layer 121 comprising first and second concentration gradients of first and second materials can be formed by varying the electroplating conditions to provide a gradient co-deposition of one or more of metals, such as yttrium and at least one of aluminum and zirconium, on the surface 112 of the component 114. The gradient co-deposition of the metals provides a gradually varying concentration of the metals through a thickness of the coating 117. In one version, the electroplating conditions can be selected to electroplate aluminum at the surface 112 of the structure 111, and to gradually increase the amount of yttrium plated onto the structure 111 while decreasing the amount of electroplated aluminum as the thickness of the coating 117 increases. This provides opposing concentration gradients of yttrium and aluminum, with a first concentration of yttrium at the surface 112 of the structure that is lower than a second concentration of yttrium at the surface 113 of the coating 117, and a first concentration of aluminum at the surface 112 of the structure 111 that is higher than a second concentration of aluminum at the surface 113 of the coating 117. By providing opposing first and second composition gradients, the composition of the coating 117 may vary smoothly from the underlying structure 111 through the thickness of the coating, thereby providing a coating 117 that is integral with the underlying structure 111 and that provides improved corrosion resistance.

In one version of forming a coating 117 comprising opposing gradient concentrations of yttrium and aluminum-containing species, the concentration of yttrium-containing electrolytes in the electroplating bath solution is gradually increased with respect to the concentration of the aluminum-containing electrolytes as the coating thickness increases. For example, more yttrium-containing electrolytes can be added to the bath solution as the thickness of the coating increases. The amount of aluminum plated on the structure 111 can be decreased with increasing thickness of the coating 117 by, for example, allowing the aluminum-containing electrolytes in the electroplating bath to be gradually used up (plated out) until there are few or no aluminum-containing electrolytes remaining in the bath 403. Also, fresh electrolyte solution can be continuously provided to the electroplating bath, the fresh solution comprising increasingly higher concentrations of yttrium-containing electrolyte and lower concentrations of aluminum-containing electrolyte, until a coating having the desired thickness and composition is formed. Other electroplating conditions that can be varied to provide a compositional gradient can include the bias voltage and the pH of the bath solution.

Furthermore, although electroplating methods may be suitable for the deposition of zirconium onto the structure 111, other methods such as physical vapor deposition, plasma spraying, chemical vapor deposition, hot isostatic pressing, sintering, and ion vapor deposition can also be used. For example, the coating 117 may comprise yttrium-containing species deposited by electroplating, and zirconium-containing species that are deposited by another method, such as plasma spraying. In one version, the coating 117 comprises partially stabilized zirconium oxide deposited by plasma spraying. The coating 117 can also comprise alternating layers 119, 120 deposited by electroplating and non-electroplating means.

The corrosion resistant component 114 having the integral surface coating 117 may be provided in an apparatus 102 suitable for processing a substrate 104, an embodiment of which is shown in FIG. 1. Generally, the apparatus 102 comprises a process chamber 106 having a wall 107, such as an enclosure wall 103, which may comprise a ceiling 118, sidewalls 114, and a bottom wall 116 that enclose a process zone 108. The wall 107 may also comprise a chamber wall liner 105 that lines at least a portion of the enclosure wall 103 about the process zone 108. In operation, process gas is introduced into the chamber 106 through a gas supply 130 that includes a process gas source 138 and a gas distributor 137. The gas distributor 137 may comprise one or more conduits 136 having one or more gas flow valves 134, and one or more gas outlets 142 around a periphery of a substrate support 110 having a substrate receiving surface 180. Alternatively, the gas distributor 130 may comprise a showerhead gas distributor (not shown). Spent process gas and etchant byproducts are exhausted from the chamber 106 through an exhaust 144 which may include a pumping channel 170 that receives spent process gas from the process zone, a throttle valve 135 to control the pressure of process gas in the chamber 106, and one or more exhaust pumps 152.

The process gas may be energized by a gas energizer 154 that couples energy to the process gas in the process zone 108 of the chamber 106. In one version, the gas energizer 154 comprises process electrodes that are powered by a power supply to energize the process gas. The process electrodes may include an electrode that is in a wall, such as a sidewall 114 or ceiling 118 of the chamber 106, which may be capacitively coupled to another electrode, such as an electrode in the support 110 below the substrate 104. Alternatively or additionally, the gas energizer 154 may comprise an antenna comprising one or more inductor coils about the chamber 106. In yet another version, the gas energizer 154 may comprise a microwave source and waveguide to activate the process gas by microwave energy in a remote zone upstream from the chamber 106. To process a substrate 104, the process chamber 106 is evacuated and maintained at a predetermined sub-atmospheric pressure though an exhaust port 171 in the chamber. The substrate 104 is then provided on the support 110 by a substrate transport 101, such as for example, a robot arm and a lift pin system. The substrate support 110 may also comprise one or more rings 109 that at least partially surround a periphery of the substrate 104 to secure the substrate 104 on the support 110, or to otherwise aid in processing the substrate 104, for example by focusing energetic plasma species onto the substrate 104. The gas energizer 154 then energizes the gas to provide an energized gas in the process zone 108 to process the substrate 104 by coupling RF or microwave energy to the gas.

Although exemplary embodiments of the present invention are shown and described, those of ordinary skill in the art may devise other embodiments which incorporate the present invention, and which are also within the scope of the present invention. For example, the coating may comprise other suitable components, such as other metals without deviating from the scope of the present invention. Also, the underlying structure 111 may form portions of chamber components 114 other than those specifically mentioned, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A substrate processing chamber component capable of being exposed to a plasma in a process chamber, the component comprising:
   (a) a substrate processing chamber component structure composed of metal; and
   (b) an electroplated coating on the substrate processing chamber component structure, the electroplated coating comprising an interface having a thickness with a gradually changing concentration of yttrium-containing species therethrough.

2. A component according to claim 1 wherein the yttrium-containing species comprises one or more of elemental yttrium and yttrium oxide.

3. A component according to claim 1 wherein the yttrium-containing species comprises yttrium oxide, and wherein the electroplated coating further comprises aluminum oxide or zirconium oxide.

4. A component according to claim 3 wherein the electroplated coating comprises a compound comprising yttrium oxide and aluminum oxide.

5. A component according to claim 3 wherein the electroplated coating comprises partially stabilized zirconium oxide.

6. A component according to claim 1 wherein the electroplated coating comprises a thickness having a gradually changing concentration of the aluminum-containing species therethrough.

7. A component according to claim 1 wherein the electroplated coating is fabricated by annealing a first electroplated layer comprising aluminum or zirconium, and a second electroplated layer comprising yttrium.

8. A component according to claim 7 comprising annealing the layers to form oxidized species.

9. A component according to claim 1 wherein the electroplated coating is fabricated by electroplating a layer comprising a mixture of (i) yttrium and (ii) aluminum or zirconium onto the surface, and annealing the layer.

10. A component according to claim 1 wherein the electroplated coating is formed by:
(i) immersing the surface of the component structure in an electroplating bath comprising a solution of yttrium species;
(ii) connecting the component structure to a negative terminal of a voltage source; and
(iii) connecting an anode immersed in the bath to a positive terminal of the voltage source, the anode comprising an inert material or material to be electroplated.

11. A component according to claim 1 wherein the metal comprises an alloy.

12. A substrate processing chamber comprising:
(a) a wall around a process zone;
(b) a substrate support in the process zone;
(c) a ring about the substrate;
(d) a gas distributor;
(e) a gas energizer; and
(f) a gas exhaust port,
wherein at least one of the wall, substrate support, ring, or gas distributor, comprises a component capable of being exposed to a plasma in a process chamber the component comprising a structure composed of metal, and having an electroplated coating comprising an interface having a thickness with a gradually changing concentration of yttrium-containing species therethrough, and
whereby a substrate transported into the process chamber can be processed by a gas released by the gas distributor, energized by the gas energizer, and exhausted by from the gas exhaust port.

13. A chamber according to claim 12 wherein the yttrium-containing species comprises one or more of elemental yttrium and yttrium oxide.

14. A chamber according to claim 12 wherein the yttrium-containing species comprises yttrium oxide, and wherein the electroplated coating further comprises aluminum oxide or zirconium oxide.

15. A chamber according to claim 12 wherein the electroplated coating comprises a compound comprising yttrium oxide and aluminum oxide.

16. A chamber according to claim 12 wherein the electroplated coating comprises partially stabilized zirconium oxide.

17. A chamber according to claim 12 wherein the electroplated coating comprises a thickness having a gradually changing concentration of the aluminum-containing species therethrough.

18. A chamber according to claim 12 wherein the electroplated coating is formed by:
(i) immersing the surface of the component structure in an electroplating bath comprising a solution of yttrium species;
(ii) connecting the component structure to a negative terminal of a voltage source; and
(iii) connecting an anode immersed in the bath to a positive terminal of the voltage source, the anode comprising an inert material or the material to be electroplated.

19. A chamber according to claim 12 wherein the metal comprises an aluminum alloy.

20. A substrate processing chamber component capable of being exposed to a plasma in a process chamber, the component comprising:
(a) a substrate processing chamber component structure; and
(b) an electroplated coating on the substrate processing chamber component structure, the electroplated coating comprising yttrium-containing species and partially stabilized zirconium oxide, and the electroplated coating comprising a thickness having a gradually changing concentration of yttrium-containing species therethrough.

21. A component according to claim 20 wherein the yttrium-containing species comprises one or more of elemental yttrium and yttrium oxide.

22. A component according to claim 20 wherein the yttrium-containing species comprises yttrium oxide, and wherein the electroplated coating further comprises aluminum oxide.

23. A component according to claim 20 wherein the electroplated coating comprises a compound comprising yttrium oxide and aluminum oxide.

24. A chamber according to claim 20 wherein the electroplated coating comprises a thickness having a gradually changing concentration of the aluminum-containing species therethrough.

25. A component according to claim 20 comprising a chamber wall, substrate support, ring, or gas distributor, of a process chamber.

26. A substrate processing chamber component capable of being exposed to a plasma in a process chamber, the component comprising:
(a) a substrate processing chamber component structure; and
(b) an electroplated coating on the substrate processing chamber component structure, the electroplated coating comprising (i) yttrium-containing species, (ii) aluminum-containing species comprising at least one of elemental aluminum or aluminum oxide, and (iii) zirconium-containing species comprising at least one of elemental zirconium or zirconium oxide.

27. A component according to claim 26 wherein the component structure comprises a metal.

28. A component according to claim 26 wherein the electroplated coating comprising a thickness having a gradually changing concentration of yttrium-containing species therethrough.

29. A substrate processing chamber comprising:
(a) a wall around a process zone;
(b) a substrate support in the process zone;
(c) a ring about the substrate;
(d) a gas distributor;
(e) a gas energizer; and
(f) a gas exhaust port,
wherein at least one of the wall, substrate support, ring, or gas distributor, comprises a component capable of being exposed to a plasma in a process chamber, the component comprising a structure having an electroplated coating comprising yttrium-containing species and partially stabilized zirconium oxide, and the electroplated coating comprising a thickness having a gradually changing concentration of yttrium-containing species therethrough.

30. A chamber according to claim 29 wherein the component structure comprises a metal.

* * * * *